(12) United States Patent
Roessler

(10) Patent No.: US 9,844,136 B2
(45) Date of Patent: Dec. 12, 2017

(54) PRINTED CIRCUIT BOARDS HAVING PROFILED CONDUCTIVE LAYER AND METHODS OF MANUFACTURING SAME

(71) Applicant: General Electric Company, Schenectady, NY (US)

(72) Inventor: Robert Joseph Roessler, Wylie, TX (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 14/557,061

(22) Filed: Dec. 1, 2014

(65) Prior Publication Data

US 2016/0157347 A1   Jun. 2, 2016

(51) Int. Cl.
| | |
|---|---|
| H01L 23/48 | (2006.01) |
| H01L 23/52 | (2006.01) |
| H05K 1/11 | (2006.01) |
| H05K 3/06 | (2006.01) |
| H05K 3/00 | (2006.01) |
| H05K 3/24 | (2006.01) |

(Continued)

(52) U.S. Cl.
CPC ............ *H05K 1/115* (2013.01); *C25D 5/022* (2013.01); *H05K 1/0263* (2013.01); *H05K 1/0265* (2013.01); *H05K 3/0091* (2013.01); *H05K 3/06* (2013.01); *H05K 3/243* (2013.01); *H05K 2201/09336* (2013.01); *H05K 2201/09509* (2013.01); *H05K 2201/09736* (2013.01)

(58) Field of Classification Search
CPC ....... H01L 23/48; H01L 23/481; H01L 23/52; H01L 23/522; H01L 23/528; H05K 3/00; H05K 1/00; H05K 1/115

USPC .................................................. 257/774, 759
See application file for complete search history.

(56) References Cited

U.S. PATENT DOCUMENTS

| | | | |
|---|---|---|---|
| 5,557,844 A | | 9/1996 | Bhatt et al. |
| 5,822,856 A | * | 10/1998 | Bhatt .................. H05K 1/113 174/262 |

(Continued)

FOREIGN PATENT DOCUMENTS

| | | |
|---|---|---|
| CN | 101389191 A | 3/2009 |
| CN | 101594750 A | 12/2009 |

(Continued)

OTHER PUBLICATIONS

Wirelaid for Modern High-Power Applications with Partial Power Management, Wurth Elektronik, Aug. 23, 2013, pp. 1-5, Niedernhall, Germany.

(Continued)

*Primary Examiner* — Chuong A Luu
(74) *Attorney, Agent, or Firm* — GE Global Patent Operation; Stephen G. Midgley

(57) ABSTRACT

A multilayer printed circuit board is provided. The multilayer printed circuit board includes a core, a first conductive layer coupled to the core, an insulating layer covering the first conductive layer, and a second conductive layer spaced from the first conductive layer by the insulating layer. The first conductive layer includes a first portion having a first thickness and a second portion having a second thickness greater than the first thickness. The second conductive layer is electrically coupled to the second portion of the first conductive layer by a conductive via extending through the insulating layer.

13 Claims, 3 Drawing Sheets

(51) Int. Cl.
*C25D 5/02* (2006.01)
*H05K 1/02* (2006.01)

(56) References Cited

U.S. PATENT DOCUMENTS

| | | | |
|---|---|---|---|
| 6,555,762 B2* | 4/2003 | Appelt | H01B 1/02 |
| | | | 174/257 |
| 2001/0019867 A1* | 9/2001 | Kawata | H01L 21/76816 |
| | | | 438/257 |
| 2002/0094604 A1 | 7/2002 | Hayama et al. | |
| 2004/0168314 A1 | 9/2004 | Pedretti et al. | |
| 2005/0005439 A1* | 1/2005 | Carpenter | H05K 1/115 |
| | | | 29/852 |
| 2006/0024862 A1 | 2/2006 | Takakusaki et al. | |
| 2007/0271783 A1* | 11/2007 | Ikeda | B32B 3/10 |
| | | | 29/852 |
| 2008/0052906 A1 | 3/2008 | Lee et al. | |
| 2008/0093117 A1 | 4/2008 | Oikawa et al. | |
| 2010/0237386 A1* | 9/2010 | Lin | H01L 23/481 |
| | | | 257/173 |
| 2012/0095170 A1 | 4/2012 | Kong et al. | |
| 2014/0232012 A1* | 8/2014 | Arai | H01L 23/481 |
| | | | 257/774 |

FOREIGN PATENT DOCUMENTS

| | | |
|---|---|---|
| CN | 101935856 A | 1/2011 |
| WO | 2014011226 A1 | 1/2014 |

OTHER PUBLICATIONS

Mauer, Peter, Achieving High Currents on PCBs with Fine-Pitch SMD Components, EE Times, Mar. 25, 2011.

Search Report and Written Opinion issued in connection with corresponding EP Application No. 15195582.0 dated May 17, 2016.

* cited by examiner

PRINTED CIRCUIT BOARDS HAVING PROFILED CONDUCTIVE LAYER AND METHODS OF MANUFACTURING SAME

BACKGROUND

The field of the disclosure relates generally to printed circuit boards, and more particularly, to printed circuit boards having a profiled conductive layer and methods of manufacturing the same.

Power electronics systems generally include a printed circuit board and a plurality of electronic components mounted to the printed circuit board. Printed circuit boards generally include a plurality of conductive traces formed from a conductive layer to provide an electrical connection between the electronic components. Some printed circuit boards have multiple conductive layers, including inner conductive layers and outer conductive layers. In power electronics systems, it is desirable for printed circuit boards to have power and signal traces located in the same conductive layer, specifically the outer conductive layer. However, conductive traces used for power components need to be capable of carrying relatively large currents as compared to signal traces, and thus require relatively larger cross-sections. It is also desirable to minimize the spacing between traces in the outer conductive layer to improve the component density of the printed circuit board.

At least some known printed circuit boards include a relatively thick outer conductive layer to increase the current-carrying capacity of the power traces in the outer conductive layer. However, using thicker conductive layers limits the minimum obtainable distance between signal traces due to the processes used to pattern the outer conductive layer. In particular, chemical etching processes used to pattern the outer conductive layer causes undercutting of the conductive layer, resulting in traces having outwardly curved or slanted sides. As a result, the minimum obtainable distance between conductive traces generally increases as the thickness of the conductive layer increases.

Other attempted solutions have included adding conductive material to the power traces in a relatively thin outer conductive layer. Utilizing a thin outer conductive layer facilities decreasing the minimum spacing between conductive traces in the outer layer, and thus improves component density of the printed circuit board. However, adding conductive material to the outer conductive layer generally results in a non-planar outer conductive layer, requiring costly and complex procedures, such as the use of step stencils or complicated solder dispensers, during subsequent processing and assembly of components on the printed circuit board.

BRIEF DESCRIPTION

In one aspect, a multilayer printed circuit board is provided. The multilayer printed circuit board includes a core, a first conductive layer coupled to the core, an insulating layer covering the first conductive layer, and a second conductive layer spaced from the first conductive layer by the insulating layer. The first conductive layer includes a first portion having a first thickness and a second portion having a second thickness greater than the first thickness. The second conductive layer is electrically coupled to the second portion of the first conductive layer by a conductive via extending through the insulating layer.

In another aspect, a method of manufacturing a printed circuit board is provided. The printed circuit board includes a core and a first conductive layer coupled to the core. The method includes shaping the first conductive layer such that the first conductive layer includes a first portion having a first thickness and a second portion having a second thickness greater than the first thickness, covering the first conductive layer with an insulating layer, providing a second conductive layer spaced from the first conductive layer by the insulating layer, and coupling the second conductive layer to the second portion of the first conductive layer with a conductive via extending through the insulating layer.

In yet another aspect, a printed circuit board assembly is provided. The printed circuit board assembly includes a printed circuit board and an electronic component. The printed circuit board includes a core, a first conductive layer coupled to the core, an insulating layer covering the first conductive layer, and a second conductive layer spaced from the first conductive layer by the insulating layer. The first conductive layer includes a first portion having a first thickness and a second portion having a second thickness greater than the first thickness. The second conductive layer is electrically coupled to the second portion of the first conductive layer by a conductive via extending through the insulating layer. The electronic component includes a pair of conductive leads coupled to the second conductive layer. The pair of conductive leads has a center-to-center spacing of less than about 0.025 inches.

Although specific features of various embodiments may be shown in some drawings and not in others, this is for convenience only. Any feature of any drawing may be referenced and/or claimed in combination with any feature of any other drawing.

DETAILED DESCRIPTION

Exemplary embodiments of printed circuit boards and methods of manufacturing printed circuit boards are described herein. The printed circuit board includes a core, a first conductive layer coupled to the core, an insulating layer covering the first conductive layer, and a second conductive layer spaced from the first conductive layer by the insulating layer. The first conductive layer includes a first portion having a first thickness and a second portion having a second thickness greater than the first thickness. The second conductive layer is electrically coupled to the second portion of the first conductive layer by a conductive via extending through the insulating layer.

As compared to some known printed circuit boards, the printed circuit boards described herein utilize a shaped or profiled inner conductive layer to enable fine pitch signal traces to be located in the same conductive layer (e.g., an outer conductive layer) as high current power traces. In particular, the printed circuit boards described herein utilize a shaped or profiled inner conductive layer having thicker, high current-carrying capacity portions connected to traces in the outer conductive layer by one or more conductive vias. The thicker portions of the inner conductive layer provide an increased current-carrying capacity to power traces located in the outer conductive layer without affecting the planarity of the outer conductive layer. As a result, the outer conductive layer can be formed from a relatively thin conductive foil, which facilitates obtaining finer minimum feature sizes in the outer conductive layer, such as the center-to-center spacing between conductive traces. Additionally, by maintaining the planarity of the outer conductive layer, the printed circuit boards and methods described herein reduce or eliminate the need for costly and complex procedures, such as the use of step stencils or complicated solder dispensers, and thereby facilitate processing and assembly of components on the printed circuit board. The profiled inner conductive layer also facilitates heat dissipation and heat transfer between outer conductive layers and inner conductive layers.

Figure 1:
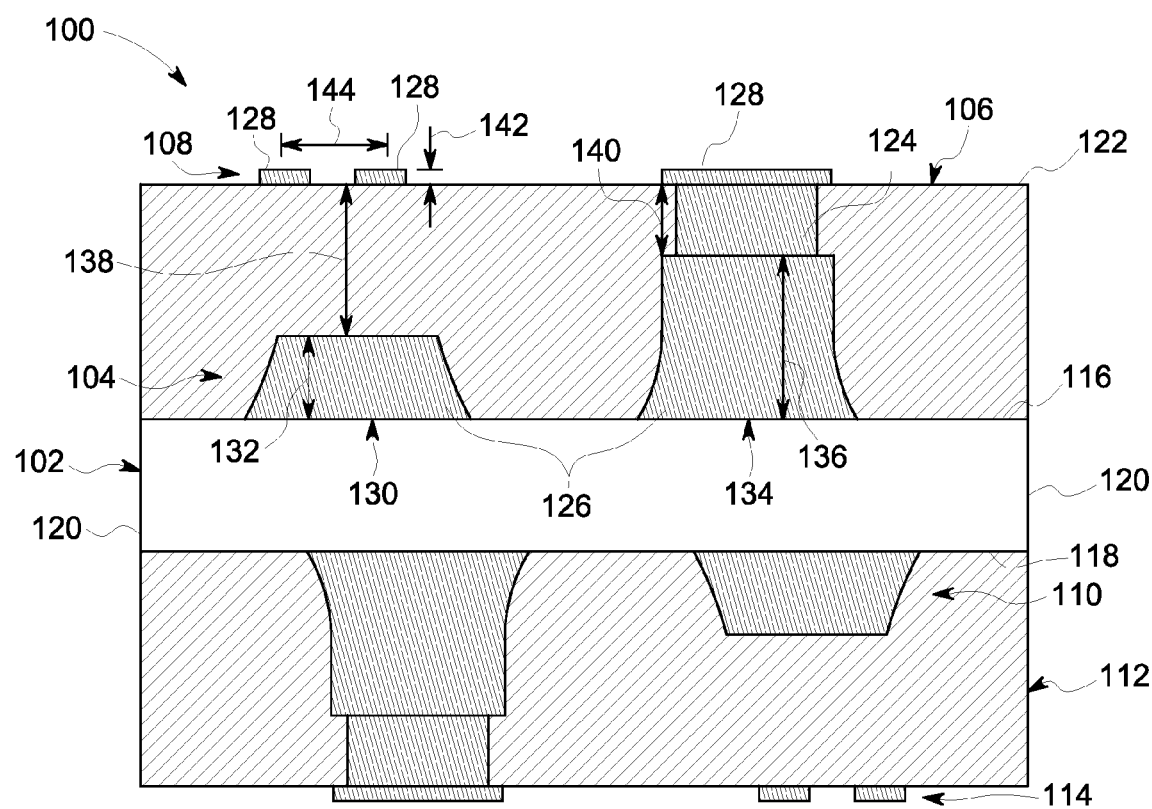
FIG. 1 is a cross-section of an exemplary printed circuit board.

FIG. 1 is a cross-section of an exemplary printed circuit board 100 including a core 102, a first conductive layer 104 coupled to core 102, an insulating layer 106 covering first conductive layer 104, and a second conductive layer 108 spaced from first conductive layer 104 by insulating layer 106. In the exemplary embodiment, printed circuit board 100 is a four layer printed circuit board having a double sided core 102, and including a third conductive layer 110 coupled to a side of core 102 opposite first conductive layer 104, a second insulating layer 112 covering third conductive layer 110, and a fourth conductive layer 114 spaced from third conductive layer 110 by second insulating layer 112. In other embodiments, printed circuit board 100 may be a multi-layered printed circuit board having contacts on only one side.

Core 102 includes a first side 116, an opposing second side 118, and a pair of ends 120 extending between first side 116 and second side 118. Core 102 includes at least one core insulating layer (not shown) configured to provide structural support for printed circuit board 100. Suitable insulating layers include, for example and without limitation, glass-reinforced epoxy composites, such as FR-4 materials, and adhesiveless laminates, such as low-flow or no-flow prepreg. Core 102 may also include one or more core conductive layers (not shown) separated by core insulating layers. In one embodiment, for example, core 102 is a copper clad laminate core having one or more copper layers laminated to a glass-reinforced epoxy layer.

First conductive layer 104 is coupled to first side 116 of core 102 by suitable attachment means including, for example and without limitation, adhesive bonding. Insulating layer 106 covers first conductive layer 104 and provides insulation between first conductive layer 104 and second conductive layer 108 to prevent undesired shorts and/or electrical interference between first conductive layer 104 and second conductive layer 108. Second conductive layer 108 is coupled to an outer side 122 of insulating layer 106 by suitable attachment means including, for example and without limitation, adhesive bonding. Second conductive layer 108 is electrically coupled to first conductive layer 104 by one or more conductive vias 124 extending through insulating layer 106.

First conductive layer 104 and second conductive layer 108 may be formed from a variety of suitable conductive materials including, for example and without limitation, copper, gold, silver, nickel, aluminum, and combinations thereof. In the exemplary embodiment, first conductive layer 104 and second conductive layer 108 are each formed from copper. In other embodiments, first conductive layer 104 and second conductive layer 108 may be formed from different conductive materials.

First conductive layer 104 and second conductive layer 108 are each patterned to define one or more conductive traces in the respective first conductive layer 104 or second conductive layer 108. First conductive layer 104 and second conductive layer 108 may be patterned using any suitable means including, for example and without limitation, chemical etching. First conductive layer 104 and second conductive layer 108 may include any suitable number of conductive traces that enable printed circuit board 100 to function as described herein. In the exemplary embodiment, two conductive traces 126 of first conductive layer 104 are shown, and three conductive traces 128 of second conductive layer 108 are shown.

Insulating layer 106 is configured to provide electrical insulation between first conductive layer 104 and second conductive layer 108. Insulating layer 106 is formed from an insulating material and has a suitable thickness to provide a desired dielectric isolation between first conductive layer 104 and second conductive layer 108. Insulating layer 106 may also be formed from a flame-retardant material, to facilitate minimizing the risk of electrical fires. Insulating layer 106 may be formed from the same insulating materials used in core 102, such as glass-reinforced epoxy composites and adhesiveless laminates, or may be formed from different insulating materials. In some embodiments, insulating layer 106 is formed by applying an uncured or semi-cured fiber reinforced epoxy resin to first conductive layer 104, placing second conductive layer 108 on the epoxy resin, and curing the epoxy resin to form insulating layer 106 and form a bond between insulating layer 106 and each of first conductive layer 104 and second conductive layer 108. In one particular embodiment, a lamination press cycle is used to facilitate filling spaces between conductive layers with the resin.

As shown in FIG. 1, second conductive layer 108 is an outermost layer of printed circuit board 100, and thus may be referred to as an outer conductive layer. First conductive layer 104 is enclosed within an interior of printed circuit board 100 by insulating layer 106, and thus may be referred to as an inner conductive layer. Second conductive layer 108 is configured to be coupled to one or more electronic components (e.g., by soldering), and first conductive layer 104 is configured to provide electrical interconnections between electronic components mounted to printed circuit board 100.

First conductive layer 104 is profiled or shaped to provide higher current-carrying capacity in desired regions of first conductive layer 104. In the illustrated embodiment, for example, first conductive layer 104 includes a first portion 130 having a first thickness 132 and a second portion 134 having a second thickness 136 greater than first thickness 132. As shown in FIG. 1, first portion 130 and second portion 134 have substantially the same width. Second portion 134 thus has a greater cross-sectional area, and a greater current-carrying capacity than first portion 130. In the exemplary embodiment, second portion 134 is configured to provide electrical connections between power components, and may be referred to as a power trace. Further, in the exemplary embodiment, first portion 130 is configured to provide electrical connections between digital and/or signal processing components, and may be referred to as a signal trace.

First conductive layer 104 may be shaped using a variety of suitable processes including, for example and without limitation, selective chemical etching, milling, and selective plating. Selective plating is a process in which conductive material is added to desired regions of a substrate (e.g., first conductive layer 104) by electroplating. In one embodiment, first conductive layer 104 is shaped by selectively plating first conductive layer 104 using a dry film mask process. In one particular embodiment, conductive material is selectively plated onto first conductive layer 104 at second portion 134 to increase the thickness of first conductive layer 104 at second portion 134 by about 0.001 inches (1 mil) to about 0.008 inches (8 mils) and, more suitably, by about 0.002 inches (2 mils) to about 0.006 inches (6 mils).

The difference in thickness between first portion 130 and second portion 134 may vary depending upon a variety of application requirements including, for example and without limitation, an initial thickness of first conductive layer 104 (i.e., a thickness of first conductive layer 104 before shaping first conductive layer 104), a desired current-carrying capacity of first portion 130 and/or second portion 134, the conductive material from which first conductive layer 104 and/or second conductive layer 108 are constructed, a desired isolation distance between first portion 130 and second conductive layer 108, and a desired distance between second portion 134 and second conductive layer 108. In some embodiments, second thickness 136 is greater than first thickness 132 by about 0.001 inches (1 mil) to about 0.008 inches (8 mils) and, more suitably, by about 0.002 inches (2 mils) to about 0.006 inches (6 mils). In the exemplary embodiment, second thickness 136 is greater than first thickness 132 by about 0.003 inches (3 mils). In another particular embodiment, second thickness 136 is greater than first thickness 132 by about 0.004 inches (4 mils).

The thicknesses of first portion 130 and second portion 134 may also vary depending upon a variety of application requirements, such as the application requirements identified above. In some embodiments, first thickness 132 is equal to a minimum thickness of first conductive layer 104, and is between about 0.001 inches (1 mil) and about 0.028 inches (28 mils) and, more suitably, is between about 0.0014 inches (1.4 mils) and about 0.008 inches (8 mils). In other embodiments, first thickness 132 may be less than 0.001 inches (1 mil), or greater than 0.028 inches (28 mils), including thicknesses up to about 0.275 inches (275 mils). In the exemplary embodiment, first thickness 132 is about 0.004 inches (4 mils). In some embodiments, second thickness 136 of second portion 134 is between about 0.004 inches (4 mils) and about 0.036 inches (36 mils) and, more suitably, is between about 0.005 inches (5 mils) and about 0.020 inches (20 mils). In the exemplary embodiment, second thickness 136 is about 0.007 inches (7 mils).

As shown in FIG. 1, first portion 130 of first conductive layer 104 is separated from second conductive layer 108 by a first thickness 138 of insulating layer 106, and second portion 134 of first conductive layer 104 is separated from second conductive layer 108 by a second thickness 140 of insulating layer 106. First thickness 138 of insulating layer 106 is sufficiently thick to isolate first portion 130 from second conductive layer 108 (i.e., to prevent electrical shorts and electrical interference between first portion 130 and second conductive layer 108). In some embodiments, for example, first thickness 138 of insulating layer 106 may be between about 0.002 inches (2 mils) and about 0.060 inches (60 mils), and more suitably, between about 0.003 inches (3 mils) and about 0.008 inches (8 mils). In other embodiments, first thickness 138 of insulating layer 106 is between about 0.012 inches (12 mils) and about 0.020 inches (20 mils). Second thickness 140 of insulating layer 106 is sufficiently small to enable second conductive layer 108 to be electrically connected to second portion 134. More specifically, second thickness 140 between second portion 134 and second conductive layer 108 is sufficiently small to enable conductive via 124 to be formed between second portion 134 and second conductive layer 108. In some embodiments, for example, second thickness 140 is between about 0.001 inches (1 mil) and about 0.006 inches (6 mils), and more suitably, between about 0.001 inches (1 mil) and about 0.004 inches (4 mils).

Conductive via 124 generally comprises a hole in printed circuit board 100 that is plated with conductive material to provide an electrical connection between two or more conductive layers of printed circuit board 100. In the exemplary embodiment, conductive via 124 extends from second conductive layer 108 through insulating layer 106 to second portion 134 of first conductive layer 104, and electrically couples second conductive layer 108 to first conductive layer 104. In particular, at least one of the plurality of conductive traces 128 of second conductive layer 108 is coupled to second portion 134 of first conductive layer 104 by conductive via 124. Conductive via 124 may be any one of a variety of industry standard vias that enables printed circuit board 100 to function as described herein including, for example and without limitation, microvias (i.e., vias having a diameter less than or equal to 150 micrometers (approximately 0.006 inches)), plated-shut vias, resin filled and plated over vias, blind vias, buried vias, and laser drilled vias. In the exemplary embodiment, conductive via 124 is a plated-shut laser-drilled microvia.

The electrical connection provided by conductive via 124 between traces 128 in second conductive layer 108 and second portion 134 of first conductive layer 104 increases the current-carrying capacity of conductive traces 128 in second conductive layer 108. In some embodiments, for example, conductive trace 128 coupled to second portion 134 of first conductive layer 104 has a current-carrying capacity of between about 1 ampere and about 200 amperes and, more suitably, between about 5 amperes and about 200 amperes. Second conductive layer 108 may be formed from a relatively thin layer of conductive material because of the increased current-carrying capacity of conductive traces 128 in second conductive layer 108. In some embodiments, for example, second conductive layer 108 may have a thickness 142 of less than about 0.0035 inches (3.5 mils), more suitably less than about 0.0014 inches (1.4 mils), and even more suitably, less than about 0.0007 inches (0.7 mils). Use of a relatively thin conductive layer for second conductive layer 108 facilitates patterning second conductive layer 108 by improving the minimum obtainable feature size in second conductive layer 108. In some embodiments, for example, a center-to-center spacing 144 between a pair of conductive traces 128 in second conductive layer 108 is less than about 0.025 inches (25 mils), more suitably less than about 0.016 inches (16 mils), and even more suitably, less than about 0.012 inches (12 mils).

As shown in FIG. 1, thickness 142 of second conductive layer 108 is substantially uniform across the entirety of second conductive layer 108. In other words, second conductive layer 108 is substantially planar. More specifically, each of conductive traces 128 of second conductive layer 108 is co-planar with one another. The flatness or planarity of second conductive layer 108 facilitates processing and assembly of components on printed circuit board 100 by reducing or eliminating the need for costly and complex procedures, such as the use of step stencils or complicated solder dispensers.

In the exemplary embodiment, third conductive layer 110, second insulating layer 112, and fourth conductive layer 114 have substantially the same construction as first conductive layer 104, insulating layer 106, and second conductive layer 108, respectively.

Figure 2:
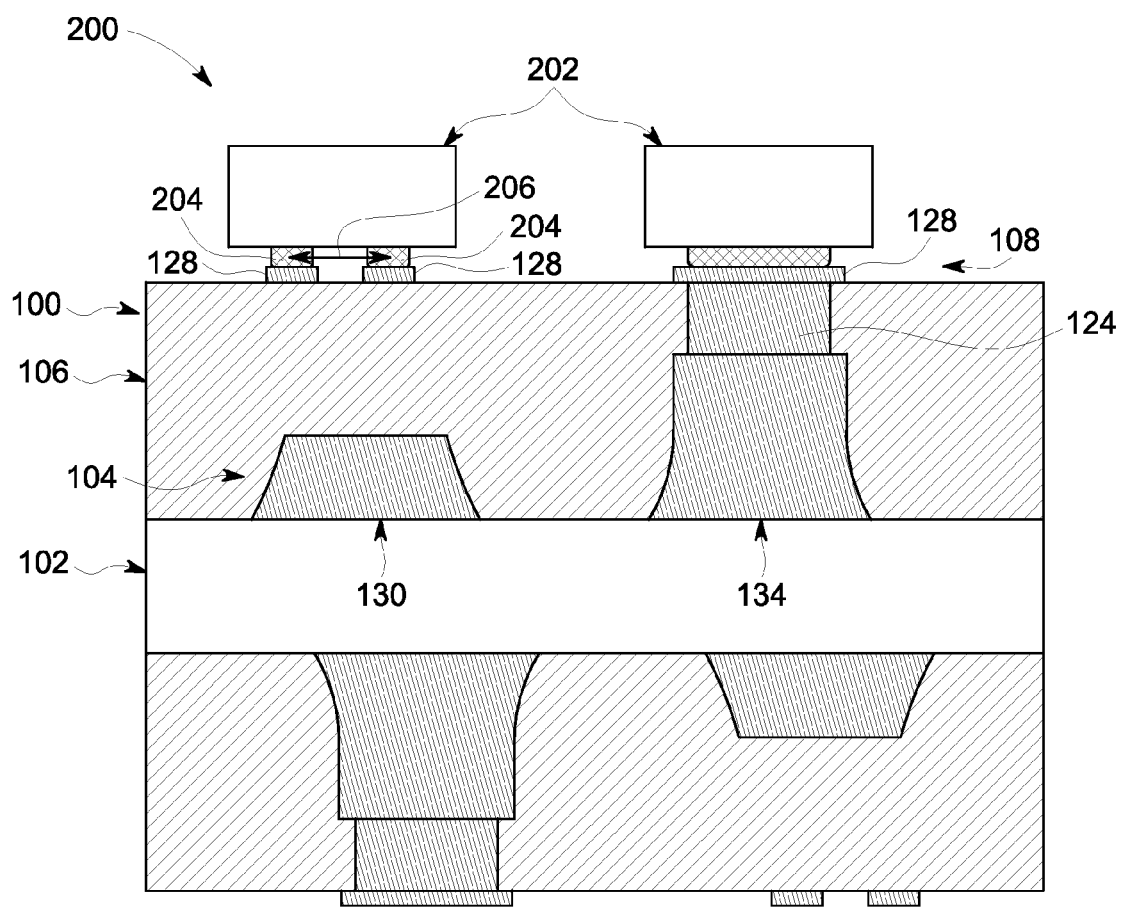
FIG. 2 is a cross-section of an exemplary printed circuit board assembly including the printed circuit board shown in FIG. 1.

FIG. 2 is a cross-section of a printed circuit board assembly 200 including printed circuit board 100 of FIG. 1 and a plurality of electronic components 202 mounted on printed circuit board 100. As shown in FIG. 2, one of electronic components 202 includes a pair of conductive leads 204. Each of conductive leads 204 is electrically coupled to one of conductive traces 128 in second conductive layer 108 (e.g., by soldering). The pair of conductive leads 204 has a center-to-center spacing 206 (i.e., pitch). In some embodiments, printed circuit board 100 is compatible with electronic components having a relatively small center-to-center spacing 206, also referred to as fine pitch components. Specifically, as noted above, second conductive layer 108 may have a relatively small thickness in some embodiments, thereby improving the minimum obtainable feature size in second conductive layer 108. In some embodiments, for example, center-to-center spacing 206 between conductive leads 204 may be less than about 0.025 inches (25 mils), less than about 0.016 inches (16 mils), and even less than about 0.012 inches (12 mils).

Figure 3:
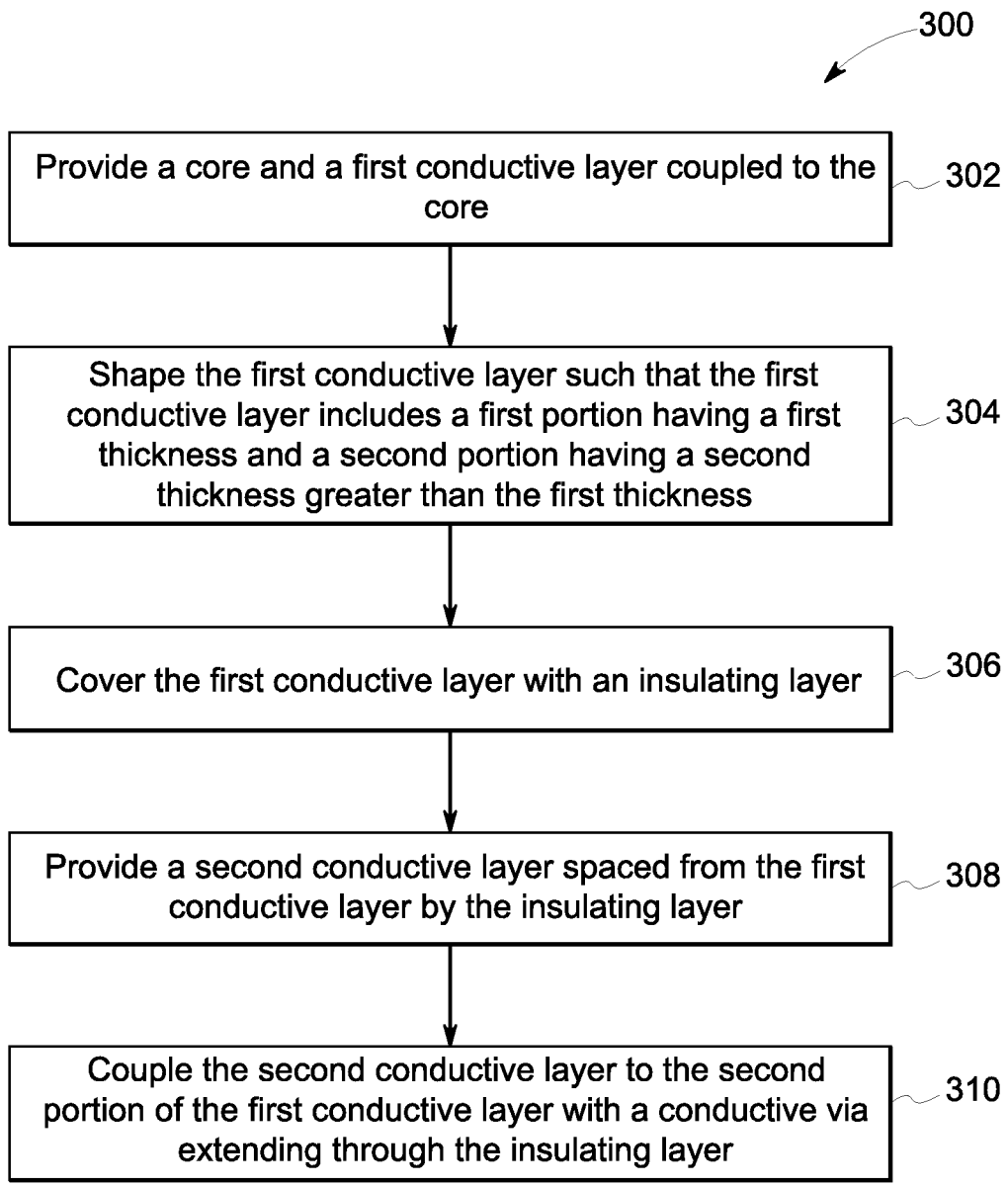
FIG. 3 is a flowchart of an exemplary method of manufacturing a printed circuit board.

FIG. 3 is a flowchart of an exemplary method 300 of manufacturing a printed circuit board, such as printed circuit board 100 (FIG. 1). A core, such as core 102 (FIG. 1), and a first conductive layer, such as first conductive layer 104 (FIG. 1), are provided 302. The first conductive layer is coupled to the core. The first conductive layer is shaped 304 such that the first conductive layer includes a first portion having a first thickness and a second portion having a second thickness greater than the first thickness. Shaping the first conductive layer may include a variety of suitable shaping processes including, for example and without limitation, selective chemical etching, milling, and selective plating. In one particular embodiment, shaping the first conductive layer includes selectively plating the first conductive layer using a dry film mask process. In some embodiments, shaping the first conductive layer includes shaping the first conductive layer such that the second thickness is between about 0.001 inches (1 mil) and about 0.008 inches (8 mils) greater than the first thickness.

The first conductive layer is covered 306 with an insulating layer, such as insulating layer 106 (FIG. 1). In some embodiments, covering the first conductive layer includes applying an uncured or semi-cured fiber reinforced epoxy resin to the first conductive layer, and curing the epoxy resin to form the insulating layer.

A second conductive layer, such as second conductive layer 108, is provided 308. The second conductive layer is provided such that the second conductive layer is spaced from the first conductive layer by the insulating layer. In some embodiments, the second conductive layer is adhered to the insulating layer by applying the second conductive layer to an uncured or semi-cured epoxy resin used to form the insulating layer.

The second conductive layer is coupled 310 to the second portion of the first conductive layer with a conductive via, such as conductive via 124 (FIG. 1), extending through the insulating layer. In some embodiments, the second conductive layer is patterned to form a plurality of conductive traces, such as conductive traces 128 (FIG. 1), and at least one of the conductive traces is coupled to the second portion of the first conductive layer by the conductive via. Patterning the second conductive layer may include a variety of suitable patterning processes including, for example and without limitation, chemical etching. In some embodiments, patterning the second conductive layer includes patterning the second conductive layer such that at least one pair of the plurality of conductive traces has a center-to-center spacing of less than about 0.025 inches.

Method 300 may be repeated as desired to form a printed circuit board having a desired number of conductive layers.

As compared to some known printed circuit boards, the printed circuit boards described herein utilize a shaped or profiled inner conductive layer to enable fine pitch signal traces to be located in the same conductive layer as high current power traces. In particular, the printed circuit boards described herein utilize a shaped or profiled inner conductive layer having thicker, high current-carrying capacity portions connected to traces in the outer conductive layer by one or more conductive vias. The thicker portions of the inner conductive layer provide an increased current-carrying capacity to power traces located in the outer conductive layer without affecting the planarity of the outer conductive layer. As a result, the outer conductive layer can be formed from a relatively thin conductive foil, which facilitates obtaining finer minimum feature sizes in the outer conductive layer, such as the center-to-center spacing between conductive traces. Additionally, by maintaining the planarity of the outer conductive layer, the printed circuit boards and methods described herein reduce or eliminate the need for costly and complex procedures, such as the use of step stencils or complicated solder dispensers, and thereby facilitate processing and assembly of components on the printed circuit board. The profiled inner conductive layer also facilitates heat dissipation and heat transfer between outer conductive layers and inner conductive layers.

Exemplary embodiments of printed circuit boards and methods of manufacturing printed circuit boards are described above in detail. The printed circuit boards and methods are not limited to the specific embodiments described herein but, rather, components of the printed circuit boards and/or operations of the methods may be utilized independently and separately from other components and/or operations described herein. Further, the described components and/or operations may also be defined in, or used in combination with, other systems, methods, and/or devices, and are not limited to practice with only the printed circuit boards described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A multilayer printed circuit board comprising:
a core comprising a first side and an opposing second side;
a first conductive layer coupled to said core, said first conductive layer comprising a first portion having a first thickness and a second portion having a second thickness greater than the first thickness, each of said first portion and said second portion extending from a first surface of said first side of said core;
a single insulating layer covering said first conductive layer; and
a second conductive layer spaced from said first conductive layer by said insulating layer, wherein said second conductive layer is an outermost conductive layer of said printed circuit board and comprises a conductive foil defining a plurality of conductive traces, wherein at least one conductive trace of said plurality of conductive traces is electrically coupled to said second portion of said first conductive layer by a conductive via distinct from said second portion and extending through said insulating layer, and wherein said first portion is isolated from said second conductive layer by said insulating layer.

2. A printed circuit board in accordance with claim 1, wherein said plurality of conductive traces includes at least one pair of conductive traces having a center-to-center spacing of less than about 0.025 inches.

3. A printed circuit board in accordance with claim 1, wherein said at least one conductive trace has a current-carrying capacity of between about 1 ampere and about 200 amperes.

4. A printed circuit board in accordance with claim 1, wherein said second conductive layer is substantially planar.

5. A printed circuit board in accordance with claim 4, wherein said second conductive layer has a substantially uniform thickness of less than about 0.0035 inches.

6. A printed circuit board in accordance with claim 1, wherein the second thickness is between about 0.001 inches and about 0.008 inches greater than the first thickness.

7. A printed circuit board in accordance with claim 6, wherein each of the first thickness and the second thickness is between about 0.0014 inches and about 0.028 inches.

8. A printed circuit board in accordance with claim 1, wherein said first conductive layer is an inner conductive layer.

9. A printed circuit board in accordance with claim 1, wherein said first portion is separated from said second conductive layer by a first thickness of said insulating layer, wherein said second portion is separated from said second conductive layer by a second thickness of said insulating layer that is less than the first thickness of the insulating layer, and wherein said insulating layer comprises a single insulating layer defining the first thickness and the second thickness.

10. A printed circuit board assembly comprising:
a printed circuit board comprising:
a core;
a first conductive layer coupled to said core, said first conductive layer comprising a first portion having a first thickness and a second portion having a second thickness greater than the first thickness;
a single insulating layer covering said first conductive layer; and
a second conductive layer spaced from said first conductive layer by said insulating layer, said second conductive layer electrically coupled to said second portion of said first conductive layer by a conductive via extending through said insulating layer, wherein said first portion is isolated from said second conductive layer by said insulating layer; and
an electronic component comprising a pair of conductive leads coupled to said second conductive layer, said pair of conductive leads having a center-to-center spacing of less than about 0.025 inches.

11. A printed circuit board assembly in accordance with claim 10, wherein said second conductive layer comprises a plurality of conductive traces, each of said conductive leads coupled to one of said conductive traces, wherein at least one of said plurality of conductive traces has a current-carrying capacity of between about 1 ampere and about 200 amperes.

12. A printed circuit board assembly in accordance with claim 11, wherein each of said plurality of conductive traces is substantially co-planar with one another.

13. A printed circuit board assembly in accordance with claim 11, wherein said second conductive layer has a substantially uniform thickness of less than about 0.0035 inches.

\* \* \* \* \*